(12) United States Patent
Kato et al.

(10) Patent No.: US 11,532,534 B2
(45) Date of Patent: Dec. 20, 2022

(54) SEMICONDUCTOR MODULE

(71) Applicant: DENSO CORPORATION, Kariya (JP)

(72) Inventors: Yoshitaka Kato, Kariya (JP); Takeshi Endo, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 17/172,361

(22) Filed: Feb. 10, 2021

(65) Prior Publication Data
US 2021/0257273 A1 Aug. 19, 2021

(30) Foreign Application Priority Data
Feb. 19, 2020 (JP) .............................. JP2020-026416

(51) Int. Cl.
| H01L 23/10 | (2006.01) |
| H01L 23/367 | (2006.01) |
| H01L 23/31 | (2006.01) |
| H01L 23/00 | (2006.01) |
| H01L 23/538 | (2006.01) |

(52) U.S. Cl.
CPC ...... H01L 23/3675 (2013.01); H01L 23/3121 (2013.01); H01L 23/5385 (2013.01); H01L 24/48 (2013.01); *H01L 2224/48227* (2013.01); *H01L 2924/181* (2013.01)

(58) Field of Classification Search
CPC . H01L 23/3672; H01L 23/3121; H01L 23/28; H01L 2224/48227
USPC .................. 257/666, 706, 773, 786
See application file for complete search history.

(56) References Cited

U.S. PATENT DOCUMENTS

| 6,078,502 A * | 6/2000 | Rostoker ........... H01L 23/49568 361/723 |
| 8,901,580 B2* | 12/2014 | Arai ........................ H01L 21/50 257/88 |
| 10,002,821 B1* | 6/2018 | Hoegerl ............ H01L 23/49582 |
| 11,145,579 B1* | 10/2021 | Kinzer ..................... H01L 25/16 |
| 2005/0035442 A1 | 2/2005 | Gerbsch et al. |
| 2005/0167742 A1* | 8/2005 | Challa ................. H01L 29/0696 257/E29.264 |
| 2007/0273009 A1 | 11/2007 | Hauenstein |
| 2008/0054439 A1 | 3/2008 | Malhan et al. |
| 2009/0039869 A1* | 2/2009 | Williams ............... H01L 24/48 324/123 R |
| 2010/0052119 A1* | 3/2010 | Liu ..................... H01L 21/6835 438/123 |
| 2011/0254177 A1 | 10/2011 | Malhan et al. |
| 2018/0145007 A1* | 5/2018 | Hatano ............... H01L 23/4952 |
| 2019/0088577 A1* | 3/2019 | Shimoyama ...... H01L 23/49503 |
| 2019/0341332 A1* | 11/2019 | Lin ........................ H01L 25/18 |

FOREIGN PATENT DOCUMENTS

JP 2019-91795 A 6/2019

* cited by examiner

*Primary Examiner* — Nitin Parekh
(74) *Attorney, Agent, or Firm* — Posz Law Group, PLC

(57) ABSTRACT

A semiconductor module includes a power element, a signal wiring, and a heat sink. The signal wiring is connected to a signal pad of the power element. The heat sink cools the power element. The power element has an active area provided by a portion where the signal pad is formed. The signal pad is thermally connected to the heat sink via the signal wiring.

11 Claims, 10 Drawing Sheets

ENLARGED

SEMICONDUCTOR MODULE

CROSS REFERENCE TO RELATED APPLICATION

This application is based on Japanese Patent Application No. 2020-026416 filed on Feb. 19, 2020, the disclosure of which is incorporated herein by reference.

TECHNICAL FIELD

The present disclosure relates to a semiconductor module including a power element and a heat sink for cooling the power element.

BACKGROUND

In a semiconductor module that has been proposed, heat sinks are arranged on a front surface and a back surface of a power element. The configuration can improve current density of a chip by radiating heat from both sides of the power element.

SUMMARY

The present disclosure provides a semiconductor module that includes a power element, a signal wiring, and a heat sink. The signal wiring is connected to a signal pad of the power element. The heat sink cools the power element. The power element has an active area provided by a portion where the signal pad is formed. The signal pad is thermally connected to the heat sink via the signal wiring.

BRIEF DESCRIPTION OF DRAWINGS

The features and advantages of the present disclosure will become more apparent from the following detailed description made with reference to the accompanying drawings. In the drawings.

DETAILED DESCRIPTION

Figure 1:
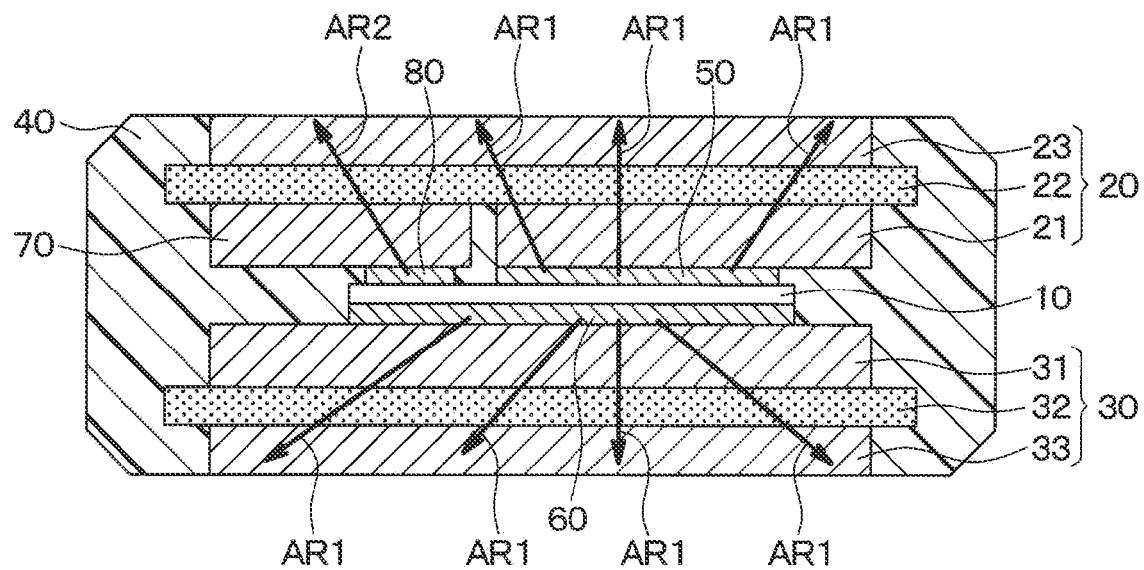
FIG. 1 is a cross-sectional view of a semiconductor module according to a first embodiment.

For example, in a semiconductor module which has been proposed, since a signal pad formed on a power element is connected to an outside by a bonding wire, heat cannot be radiated from the signal pad. Thus, there is room for improving the heat radiation performance.

The present disclosure provides a semiconductor module having higher heat radiation performance.

An exemplary embodiment of the present disclosure provides a semiconductor module that includes a power element, a signal wiring, and a heat sink. The signal wiring is connected to a signal pad of the power element. The heat sink cools the power element. The power element has an active area provided by a portion where the signal pad is formed. The signal pad is thermally connected to the heat sink via the signal wiring.

In the exemplary embodiment of the present disclosure, since the portion where the signal pad is formed is provided as the active area, current flows and heat is generated in the region where the signal pad is formed in addition to the region where the source pad is formed. Further, since the signal pad and the heat sink are thermally connected, it is possible to sufficiently radiate heat from the signal pad. Thus, the heat radiation performance is improved.

Hereinafter, embodiments of the present disclosure will be described with reference to the drawings. In each embodiment described below, same or equivalent parts are designated with the same reference numerals.

First Embodiment

A first embodiment will be described. A semiconductor module of the present embodiment is mounted on a vehicle such as an automobile, and is applied to a power conversion device or the like in various electronic devices for the vehicle.

As shown in FIG. 1, the semiconductor module includes a power element 10 as a heat generating element and heat sinks 20 and 30. The power element 10 and the heat sinks 20 and 30 are sealed by a mold resin 40.

The power element 10 is a vertical semiconductor element provided by a compound semiconductor such as Si, SiC, GaN, or $Ga_2O_3$. The power element 10 flows a current from one surface to the other surface through a trench and a contact which are not shown in drawings.

Figure 2:
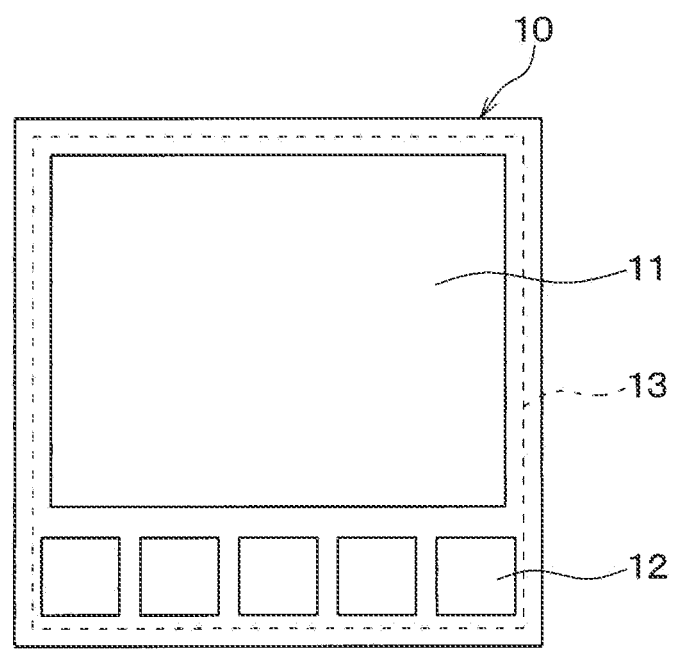
FIG. 2 is a top view of a power element.

As shown in FIG. 2, a source pad 11 and a signal pad 12 for extracting a signal from the power element 10 are formed on a front surface of the power element 10. A drain is formed on the entire surface of the power element 10 on the back surface.

In the power element 10 of the present embodiment, in addition to a portion where the source pad 11 is formed, trenches and contacts (not shown) are formed in a portion where the signal pad 12 is formed. As a result, both the portion where the source pad 11 is formed and the portion where the signal pad 12 is formed are provided as an active area 13 in which the current flows from one surface to the other surface of the power element 10. An insulating film (not shown) provided by such as $SiO_2$ or $Si_3N_4$ is formed on the front surface of the power element 10, and the signal pad 12 is formed on the insulating film.

As shown in FIG. 1, the power element 10 is connected to the heat sinks 20 and 30 by the solder 50 and 60, respectively. The heat sinks 20 and 30 cool the power element 10, and are made of a metal insulating substrate such as Direct Bonded Copper (DBC) or Direct Bonded Aluminum (DBA).

Specifically, the heat sink 20 has a structure in which a metal layer 21, an insulating layer 22, and a metal layer 23 are stacked in this order. Similarly, the heat sink 30 has a structure in which a metal layer 31, an insulating layer 32, and a metal layer 33 are stacked in this order. The metal layers 21, 23, 31, and 33 are made of, for example, Cu or Al, and the insulating layers 22 and 32 are made of, for example, ceramics such as silicon nitride, alumina, or aluminum nitride, or an insulating resin.

The heat sink 20 is connected to the front surface of the power element 10 by solder 50 in the metal layer 21, and a surface of the metal layer 23 opposite to the insulating layer 22 is provided as a heat radiating surface exposed from the mold resin 40. The heat sink 30 is connected to the back surface of the power element 10 by solder 60 in the metal layer 31, and a surface of the metal layer 33 opposite to the insulating layer 32 is provided as a heat radiating surface exposed from the mold resin 40.

The signal wiring 70 is stacked on a surface of the insulating layer 22 on which the metal layer 21 is stacked. The signal wiring 70 separates from the metal layer 21. The signal wiring 70 extracts a signal from the power element 10. The metal layer 21 is connected to a portion of the power element 10 where the source pad 11 is formed, and the signal wiring 70 is connected to the signal pad 12 by the solder 80.

The signal wiring 70 of the present embodiment is provided by a wiring pattern formed on the insulating layer 22. The signal pad 12 is thermally connected to the heat sink 20 via the solder 80 and the signal wiring 70. The signal wiring 70 may be connected to the signal pad 12 by a sintered material, direct bonding using ultrasonic waves, or the like.

Figure 3:
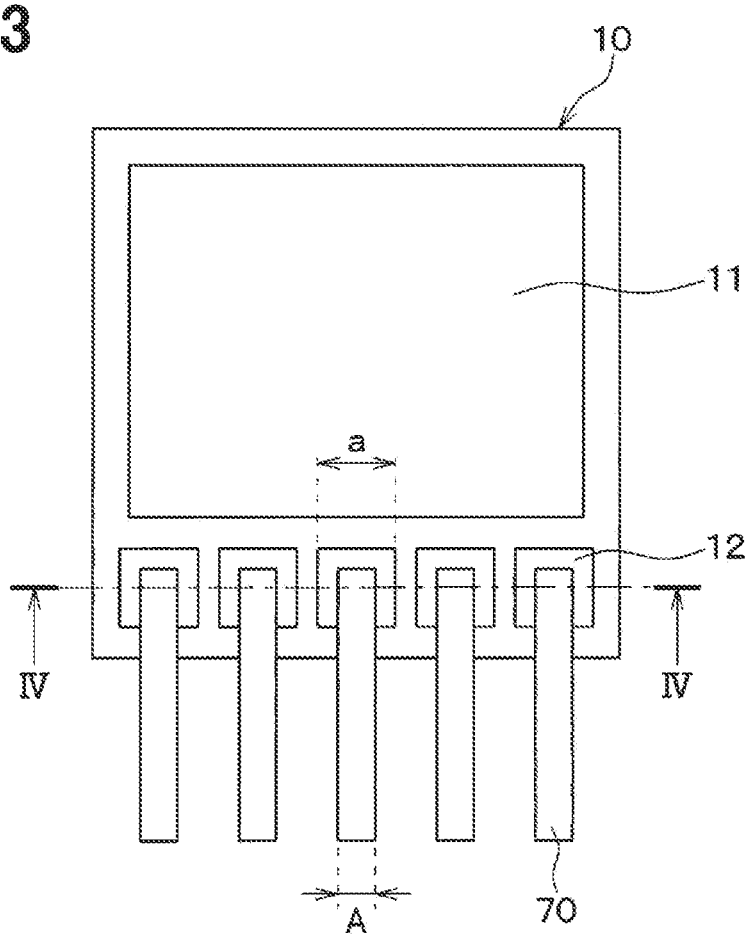
FIG. 3 is a top view of the power element and signal wirings.

As shown in FIG. 3, a plurality of signal pads 12 are formed on the power element 10, and the signal wiring 70 is arranged for each signal pad 12. Each of the plurality of signal wirings 70 has a linear shape, and extends in parallel from the upper portion of the signal pad 12 toward the outside of the power element 10. The shape and arrangement of the signal wirings 70 may be different from the configuration above.

Figure 4:
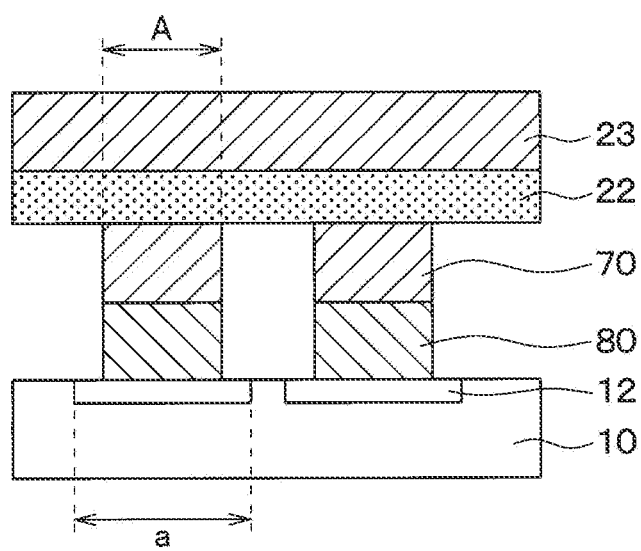
FIG. 4 is a cross-sectional view taken along line IV-IV in FIG. 3.

In the present embodiment, the width of the signal pad 12 is greater than the width of the signal wiring 70 in an in-plane direction perpendicular to the thickness direction of the signal pad 12 and the signal wiring 70. Specifically, as shown in FIGS. 3 and 4, the width a of the signal pad 12 is greater than the width of the signal wiring 70 in a direction perpendicular to an extending direction to which the signal wiring 70 extends and a stacking direction to which the power element 10, the heat sinks 20 and 30 are stacked.

The effects of this embodiment will be described. The present inventors investigated the thermal resistance ratios of comparative example 1 shown in FIGS. 5 and 6 and the semiconductor module of the present embodiment by thermal simulation.

Figure 5:
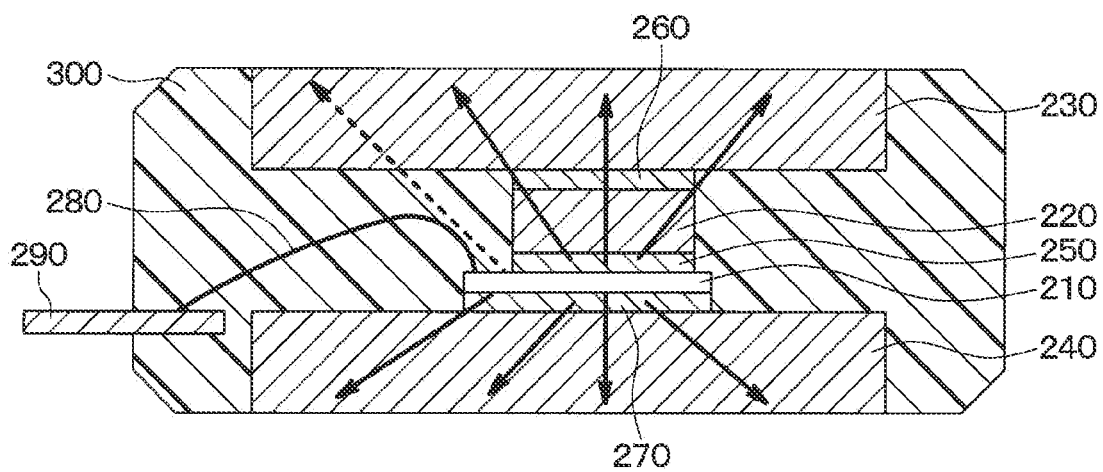
FIG. 5 is a cross-sectional view of a comparative example.
Figure 6:
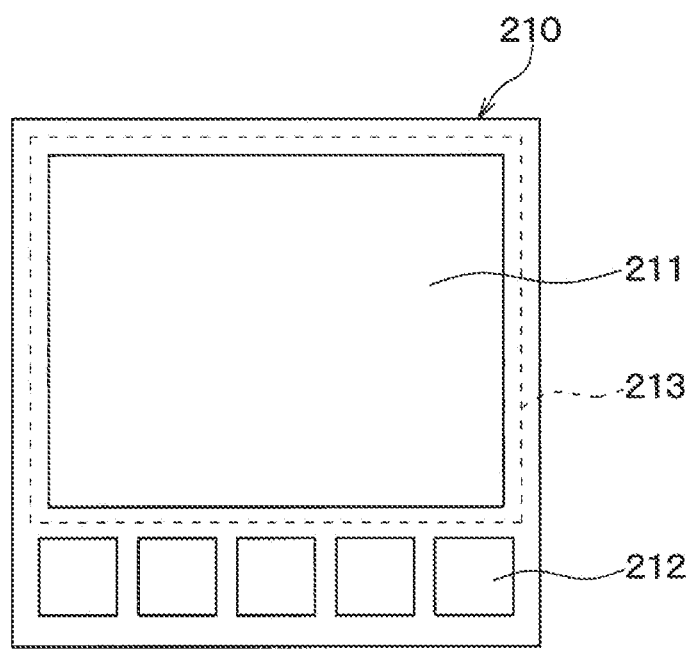
FIG. 6 is a top view of a power element in the comparative example.

The semiconductor module of comparative example 1 shown in FIG. 5 includes a power element 210, a Cu block 220, and heat sinks 230 and 240 made of Cu. As shown in FIG. 6, unlike the power element 10, the power element 210 has an active area 213 on a portion where a source pad 211 is formed among the portion where the source pad 211 is formed and a portion where a signal pad 212 is formed. The portion where the signal pad 212 is formed is an inactive area where no current flows.

The Cu block 220 is stacked on the power element 210 by the solder 250, the heat sink 230 is stacked on the Cu block 220 by the solder 260, and the heat sink 240 is stacked on the power element 210 by the solder 270. The signal pad 212 of the power element 210 is connected to one end of a signal wiring 290 by a bonding wire 280 made of Al.

These components are molded by a resin 300 so that a surface of each of the heat sinks 230 and 240 opposite to the power element 210 and an end of the signal wiring 290 opposite to a portion to which the bonding wire 280 is connected are exposed.

Further, the heat simulation is performed for comparative example 2 having a similar configuration to the configuration of the present embodiment except that a portion of a power element where a signal pad is provided as an inactive area.

In comparative example 1, although heat was radiated in a path indicated by a solid arrow in FIG. 5, heat is hardly radiated in a path indicated by a broken line arrow in FIG. 5 because the signal pad 212 is not thermally connected to the heat sink 230. Further, in comparative example 2, heat is concentrated around the source pad since the portion where the signal pad is formed is provided as the inactive area. Thus, although heat is radiated from the signal pad, the amount of heat radiation is small.

In the present embodiment, heat is radiated in a path indicated by an arrow AR1 in FIG. 1, and heat is largely radiated from the portion where the signal pad 12 is formed in a path indicated by an arrow AR2. Thus, the heat radiation performance is improved. Specifically, when the thermal resistance ratio of comparative example 1 is defined as 1, the thermal resistance ratio of comparative example 2 is 0.99, and the thermal resistance ratio of the present embodiment is 0.9.

As described above, in the present embodiment, the signal pad 12 of the power element 10 is thermally connected to the heat sink 20 by the signal wiring 70. Thus, a heat radiation path from the signal pad 12 to the heat radiation surface of the semiconductor module is secured. Further, in the power element 10, the portion where the signal pad 12 is formed is also provided as the active area. Thus, the portion where the signal pad 12 is formed also generates heat. As a result, the heat radiation performance of the present embodiment is higher than that of the conventional semiconductor module, and the double-sided heat radiation structure can be effectively utilized.

Further, in the present embodiment, since the active area is widened by the portion where the signal pad 12 is formed being provided as the active area, the amount of current per chip can be increased.

Figure 7:
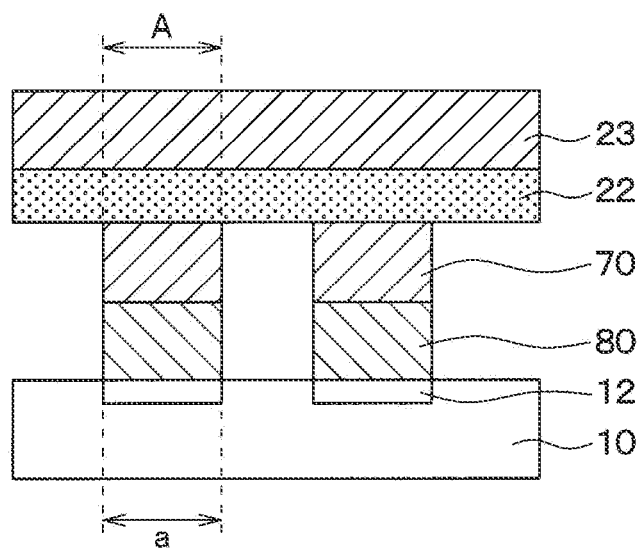
FIG. 7 is a cross-sectional view of the comparative example.
Figure 8:
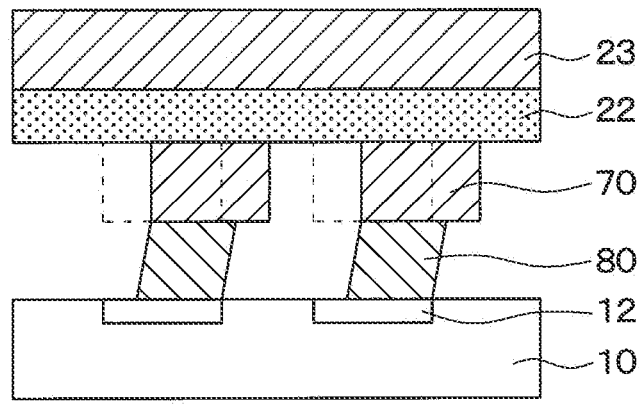
FIG. 8 is a cross-sectional view showing a state in which the positions of signal wirings are displaced in the comparative example.
Figure 9:
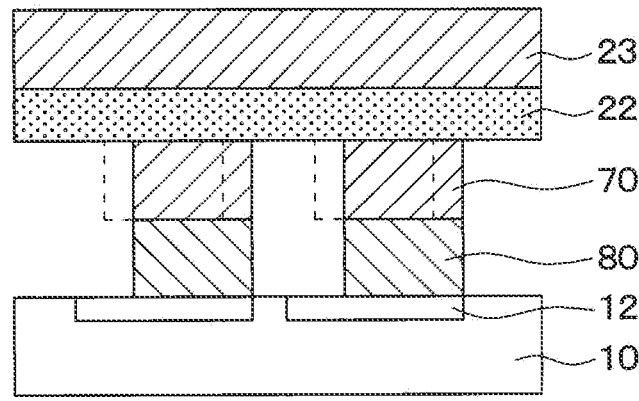
FIG. 9 is a cross-sectional view showing a state in which the positions of signal wirings are displaced in the first embodiment.

Further, in the present embodiment, the width a of the signal pad 12 is greater than the width A of the signal wiring 70. For example, the width a may be equal to the width A as shown in FIG. 7. In this case, when the positions of the signal pad 12 and the signal wiring 70 are displaced as shown in FIG. 8 due to manufacturing variation, the width of the solder 80 decreases and the heat radiation area decreases. On the other hand, in the present embodiment, the width a of the signal pad 12 is greater than the width A of the signal wiring 70. Even when the positions of the signal pad 12 and the signal wiring 70 are displaced as shown in FIG. 9, the reduction of the width of the solder 80 decreases and deterioration of heat radiation performance is suppressed. In FIGS. 8 and 9, the position of the signal wiring 70 in the design is indicated by a broken line.

Figure 10:
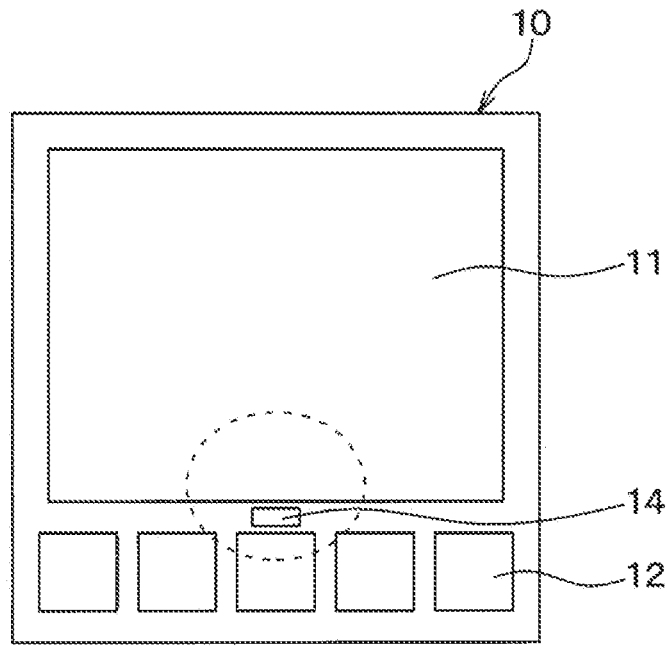
FIG. 10 is a top view of the power element in a modified example of the first embodiment.

As shown in FIG. 10, a temperature sense diode 14 may be formed on the power element 10 in order to detect the temperature of the power element 10. In the power element in which the portion where the source pad is formed is provided as the active area, the central portion of the source pad has the maximum temperature in the power element. On the other hand, in the present embodiment in which the active area extends to the portion where the signal pad 12 is formed, the portion shown by the broken line in FIG. 10, that is, the portion between the source pad 11 and the signal pad 12 has the maximum temperature. Thus, the accuracy for detecting temperature is improved by forming the temperature sense diode 14 between the source pad 11 and the signal pad 12 as shown in FIG. 10. Further, the accuracy for detecting temperature is further improved by forming the temperature sense diode 14 also in the central portion of the source pad 11.

The entire portion where the signal pad 12 is formed may be provided as the active area, or a part of the portion where the signal pad 12 is formed may be provided as the active area. In the power element 10 of the present embodiment, in order to electrically insulate the active area from the signal pad 12, it is necessary to form the insulating film (not shown) as described above. Such an insulating film has a low thermal conductivity, and thus the heat radiation performance may be deteriorated in a portion where the insulating film is present. When a large current flows due to a failure of another device or the like and the current is cut off in order to suppress the failure of the semiconductor module, heat may stay even in the structure that radiates heat from the signal pad 12 at the time of transition up to about 100 μs required for the current cutoff.

The heat staying at the time of transition can be improved by lowering the density of the active cells in the region where the signal pad 12 is formed as compared with other regions. For example, the number of active cells can be reduced by reducing the number of trenches and contacts (not shown) formed in the power element 10.

Figure 11:
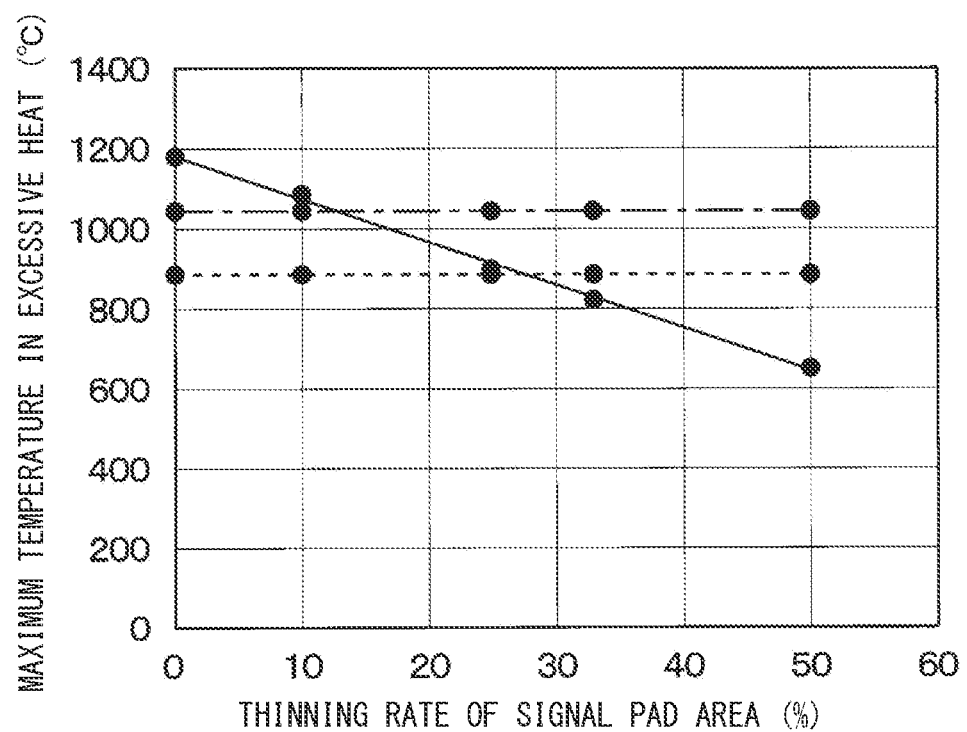
FIG. 11 is a diagram showing relationship between the thinning rate of active cells and element temperature.

FIG. 11 is a diagram for the results of experiments conducted by the present inventors. In FIG. 11, the solid line indicates the temperature of the portion where the signal pad 12 is formed, the broken line indicates the temperature of the inner peripheral portion of the source pad 11, and the dash-dot line indicates the temperature of the outer peripheral portion and the peripheral portion of the source pad 11. As shown in FIG. 11, the temperature around the signal pad 12 when a large current momentarily flows through the power element 10 decreases as the number of active cells decreases. For example, when the thinning rate of the active cell is less than 10%, the temperature around the signal pad 12 is the maximum temperature in the power element 10, and the corner portion on the opposite side of the signal pad 12 has the high temperature. As described above, when the thinning rate is less than 10%, the temperature around the signal pad 12 becomes high. Thus, there is room for further reducing the number of active cells and improving stay of the heat.

On the other hand, when the number of active cells in the portion where the signal pad 12 is formed is reduced more than necessary, the on-resistance as a whole increases, which is not preferable. For example, when the thinning rate of the active cell is more than 30%, the corner portion of the power element 10 opposite to the signal pad 12 has the maximum temperature, and the central portion of the source pad 11 has the high temperature. Thus, when the thinning rate is more than 30%, the temperature around the signal pad 12 drops more than necessary, and the on-resistance increases, which is not preferable.

When the thinning rate of the active cell is equal to or more than 10% and equal to or less than 30%, the corner portion of the power element 10 opposite to the signal pad 12 has the maximum temperature, and the periphery of the signal pad 12 has the second maximum temperature. Thus, by setting the thinning rate to equal to or more than 10% and equal to or less than 30%, that is, setting the density of active cells to equal to or more than 70% and equal to or less than 90% of other regions, the stay of heat can be sufficiently improved and the increase in on-resistance can be suppressed.

When the insulating film under the signal pad 12 is formed not in the entire periphery of the signal pad 12 but in a part thereof, the active cells in the portion where the insulating film is formed may be thinned out.

Second Embodiment

A second embodiment will be described. The present embodiment is different from the first embodiment in wiring for extracting the signal from the power element 10. The other configurations are similar to those of the first embodiment. Thus, only a part different from the first embodiment will be described.

Figure 12:
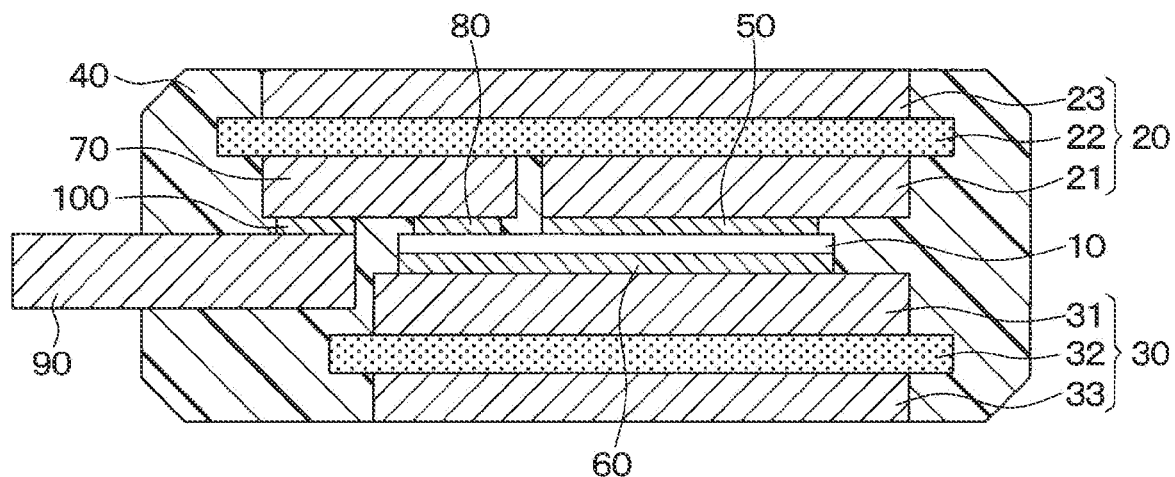
FIG. 12 is a cross-sectional view of a semiconductor module according to a second embodiment.

In the present embodiment, the wiring for extracting the signal from the power element 10 extends to the outside of the mold resin 40. Specifically, as shown in FIG. 12, a signal terminal 90 is connected to the tip of the signal wiring 70. The signal terminal 90 is stacked on the signal wiring 70 by solder 100 at one end, and the other end is exposed from the mold resin 40. With such a configuration, the heat radiation performance can be further improved.

Figure 13:
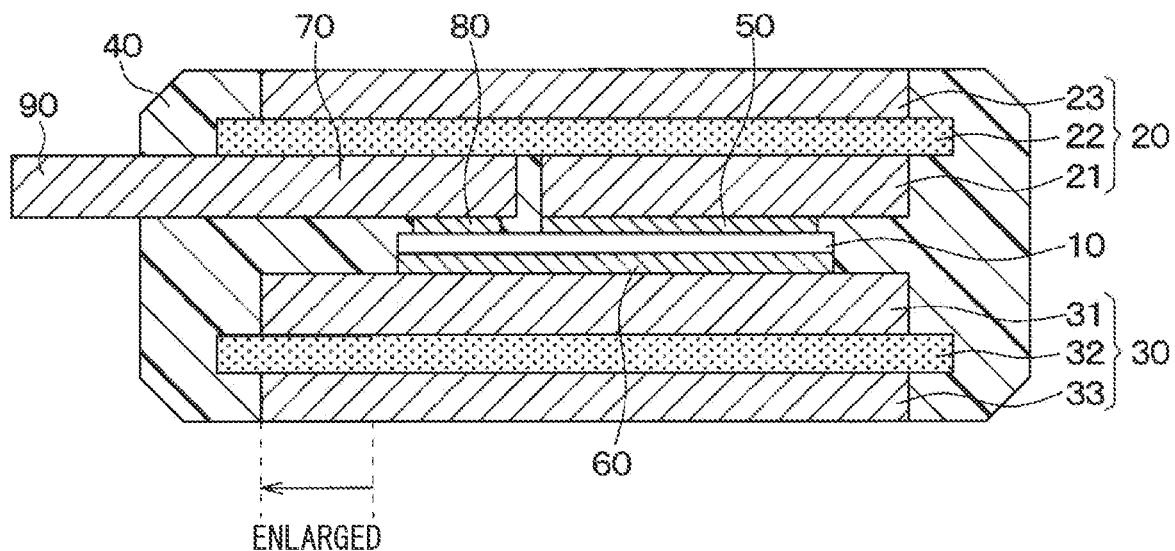
FIG. 13 is a cross-sectional view of a modified example of the second embodiment.

As shown in FIG. 13, the signal terminal 90 may be formed by extending the signal wiring 70 to the outside of the insulating layer 22 in the in-plane direction perpendicular to the thickness direction. By integrating the signal terminal 90 with the signal wiring 70 as described above, a space is generated under the signal terminal 90. Thus, the size of the heat sink 30 can be expanded, and the heat radiation performance can be further improved.

Third Embodiment

A third embodiment will be described. The present embodiment is different from the first embodiment in a way thermally connecting between the signal pad 12 and the heat sink 20. The other configurations are similar to those of the first embodiment. Thus, only a part different from the first embodiment will be described.

Figure 14:
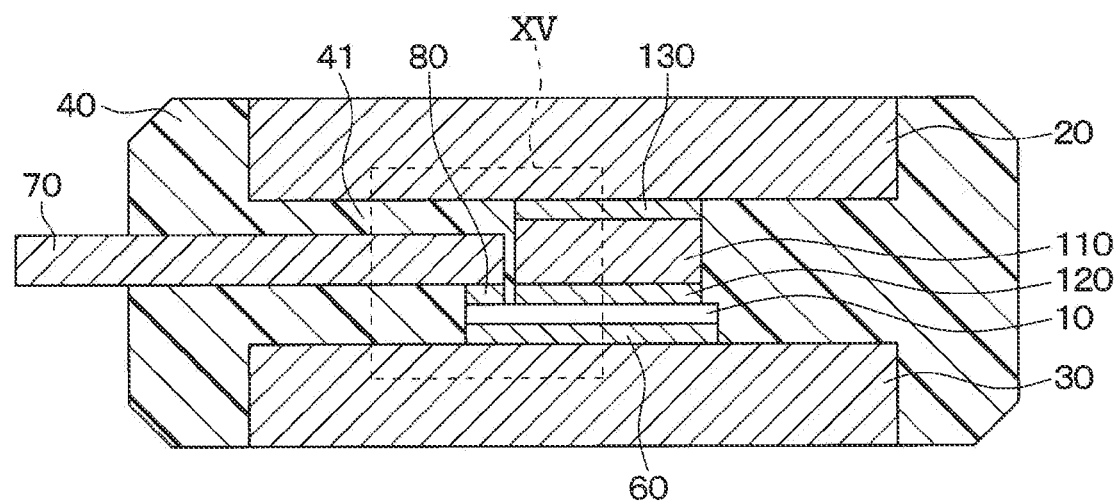
FIG. 14 is a cross-sectional view of a semiconductor module according to a third embodiment.

As shown in FIG. 14, in the present embodiment, the heat sinks 20 and 30 are provided by Cu blocks. Further, the semiconductor module of this embodiment includes a Cu block 110, and the power element 10 is connected to the heat sink 20 via the solder 120, the Cu block 110, and the solder 130.

Figure 15:
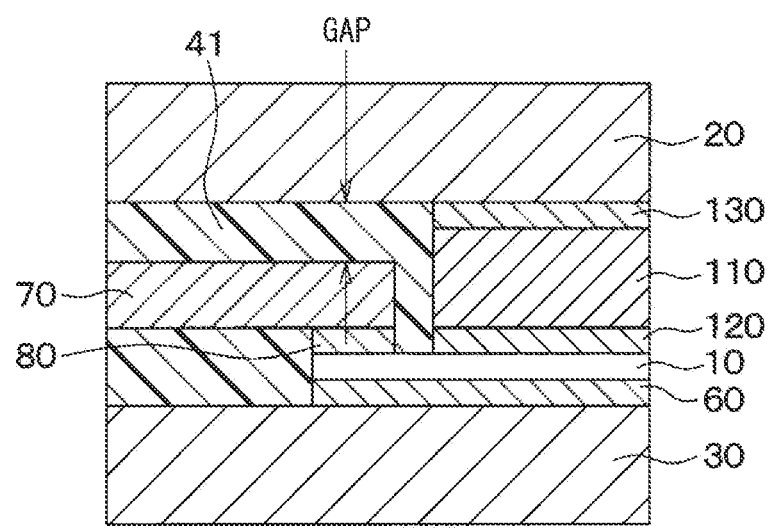
FIG. 15 is an enlarged view of a portion XV in FIG. 14.

Further, as shown in FIGS. 14 and 15, the signal wiring 70 separates from the heat sink 20, and a resin layer 41 made of the mold resin 40 is formed between the signal wiring 70 and the heat sink 20.

Even when the signal wiring 70 and the heat sink 20 are separated from each other as described above, the heat radiation path is secured by using the mold resin 40 as a high thermal conductive resin and thermally connecting the signal pad 12 and the heat sink 20.

Figure 16:
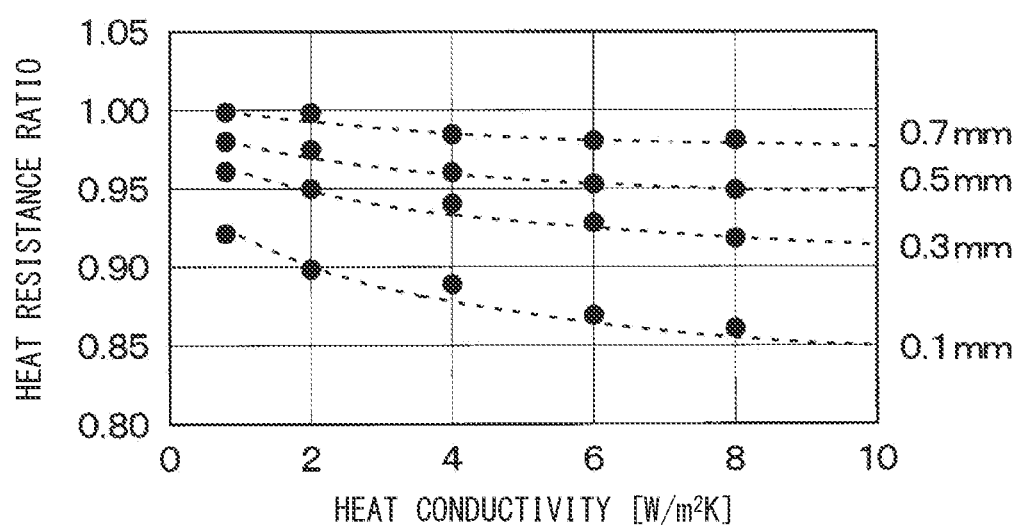
FIG. 16 is a diagram showing relationship between thermal conductivity and thermal resistance ratio of a resin.

The present inventor has experimentally investigated the relationship among the thermal conductivity of the mold resin 40, the gap between the signal wiring 70 and the heat sink 20, and the thermal resistance ratio of the semiconductor module. As shown in FIG. 16, when the thermal conductivity of the mold resin 40 is equal to or more than 2 $W/m^2K$ and the gap between the signal wiring 70 and the heat sink 20 is equal to or less than 0.3 mm, the thermal resistance ratio becomes equal to or less than about 0.95, and the heat radiation performance is improved. The thermal conductivity of a general resin is about 1 $W/m^2K$. Here, the thermal resistance ratio is set to 1 in a case where the thermal conductivity of the mold resin 40 is 1 $W/m^2K$ and the gap between the signal wiring 70 and the heat sink 20 is 0.7 mm.

As described above, even when the signal pad 12 is thermally connected to the heat sink 20 via the resin layer 41, the heat radiation performance can be improved as in the first embodiment.

Fourth Embodiment

A fourth embodiment will be described. In the present embodiment, a width of the signal pad 12 is different from that of the first embodiment. The other configurations are similar to those of the first embodiment. Thus, only a part different from the first embodiment will be described.

Figure 17:
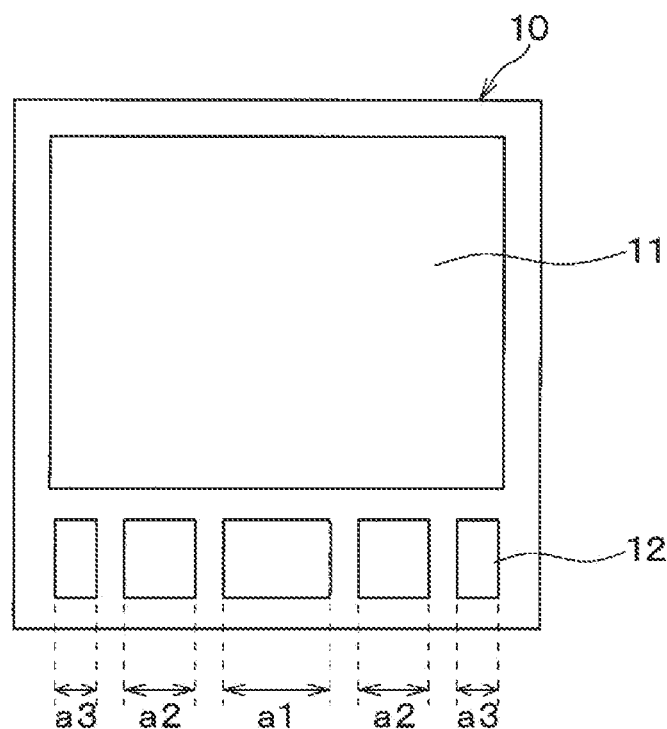
FIG. 17 is a top view of a power element according to a fourth embodiment.

As shown in FIG. 17, in the present embodiment, the width of each signal pad 12 is greater as the signal pad 12 approaches the central portion of the power element 10. Specifically, the power element 10 of the present embodiment has five signal pads 12 aligned. Then, the width of the signal pad 12 located at the center of the arrangement is defined as width a1, the width of the two signal pads 12 on both sides thereof is defined as width a2, and the width of the two signal pads 12 located on the outermost side is defined as width a3. It is satisfied that the width a1>the width a2>the width a3. The width a2 may be equal to the width a3.

Heat generated when a current flows through the power element 10 increases for the signal pad 12 being close to the center of the arrangement. Thus, among the plurality of signal pads 12, the width of the signal pad 12 close to the center of the power element 10 is greater than the width of the signal pad 12 farther from the center of the power element 10. The configuration can further improve the heat radiation performance.

In the experiments conducted by the present inventors, when the thermal resistance ratio of the semiconductor module in which the width a1=the width a2=the width a3 was defined to 1, the thermal resistance ratio of the semiconductor module in which the width a1>the width a2≥the width a3 was about 0.98. The two semiconductor modules were formed so that the total area of the signal pads 12 was the same.

Figure 18:
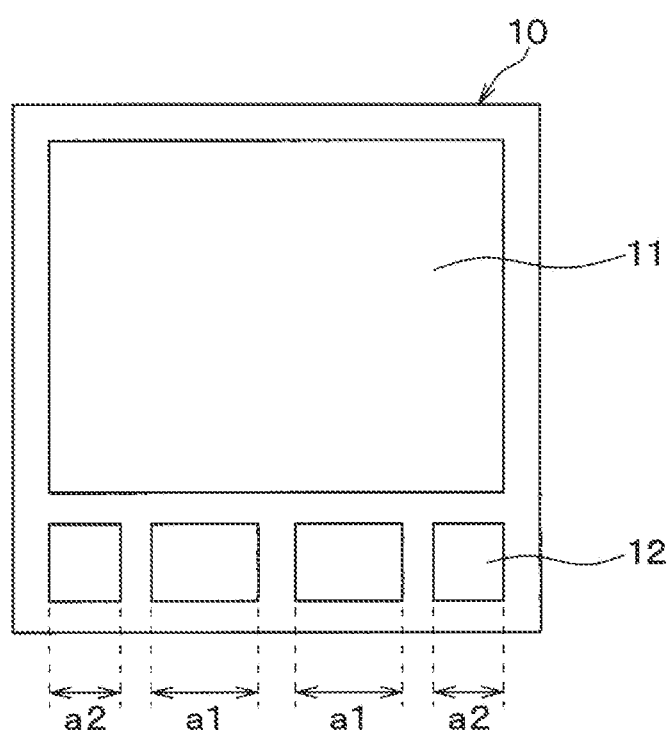
FIG. 18 is a top view of a power element when the number of signal pads is an even number and FIG. 19 is a top view of a power element and a signal wiring according to a fifth embodiment.

In the present embodiment, the case where five signal pads 12 are formed has been described, but even when the number of signal pads 12 is different from five, the heat radiation performance can be further improved by the similar configuration. When the number of signal pads 12 is an even number, the widths of the two signal pads 12 located at the center of the arrangement may be greater than the widths of the other signal pads 12. For example, as shown in FIG. 18, when the power element 10 includes four signal pads 12, the width of the two signal pads 12 located at the center of the arrangement is defined as width a1, and the width of the outer signal pads 12 is defined as width a2. It is satisfied that the width a1>the width a2.

Fifth Embodiment

A fifth embodiment will be described. In the present embodiment, a width of the signal wiring 70 is different from that of the fourth embodiment. The other configurations are similar to those of the fourth embodiment. Thus, only a part different from the fourth embodiment will be described.

Figure 19:
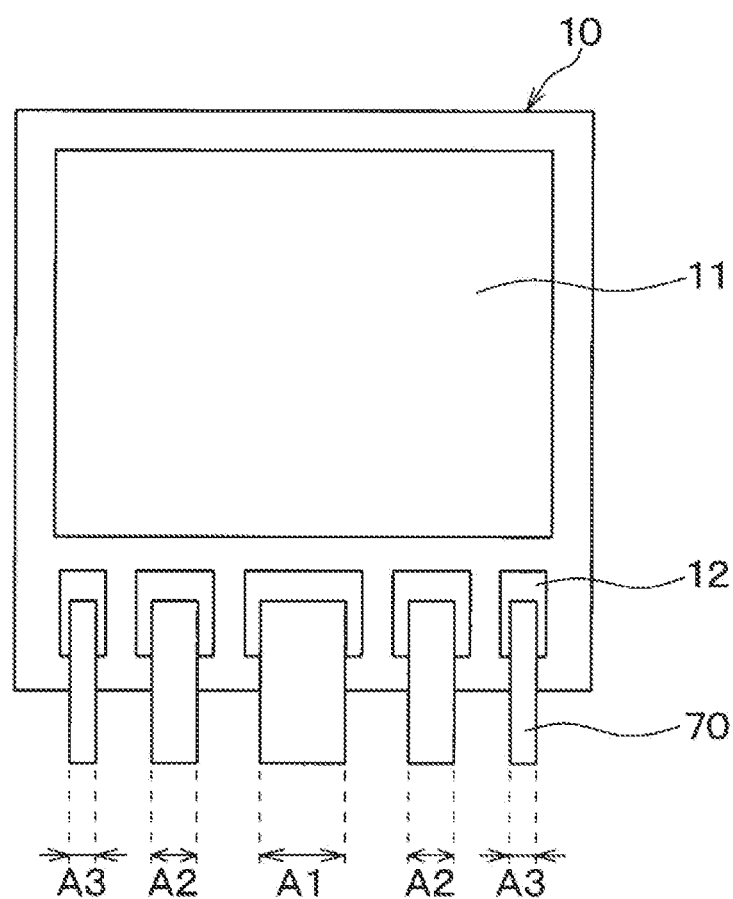

In the present embodiment, the width of each signal wiring 70 is greater as the signal wiring 70 approaches the central portion of the power element 10, correspondingly to the width of the signal pad 12. That is, as shown in FIG. 19, five signal wirings 70 are arranged corresponding to the five signal pads 12. Then, the width of the signal wiring 70 located at the center of the arrangement is defined as width A1, the width of the two signal wirings 70 on both sides thereof is defined as width A2, and the width of the two signal wirings 70 located on the outermost side is defined as width A3. It is satisfied that the width A1>the width A2≥the width A3.

Thus, among the plurality of signal wirings 70, the width of the signal wiring 70 close to the center of the power element 10 is greater than the width of the signal wiring 70 farther from the center of the power element 10. The configuration can further improve the heat radiation performance.

Other Embodiments

The present invention is not limited to the above embodiments, and can be appropriately modified within the scope described in the claims. Individual elements or features of a particular embodiment are generally not limited to that particular embodiment, but, where applicable, are interchangeable and can be used in a selected embodiment, even if not specifically shown or described. The constituent element(s) of each of the above embodiments is/are not necessarily essential unless it is specifically stated that the constituent element(s) is/are essential in the above embodiment, or unless the constituent element(s) is/are obviously essential in principle. A quantity, a value, an amount, a range, or the like, if specified in the above-described example embodiments, is not necessarily limited to the specific value, amount, range, or the like unless it is specifically stated that the value, amount, range, or the like is necessarily the specific value, amount, range, or the like, or unless the value, amount, range, or the like is obviously necessary to be the specific value, amount, range, or the like in principle. Furthermore, a material, a shape, a positional relationship, or the like, if specified in the above-described example embodiments, is not necessarily limited to the specific shape, positional relationship, or the like unless it is specifically stated that the material, shape, positional relationship, or the like is necessarily the specific material, shape, positional relationship, or the like, or unless the shape, positional relationship, or the like is obviously necessary to be the specific shape, positional relationship, or the like in principle.

For example, in the second embodiment, the signal pad 12 may be thermally connected to the heat sink 20 via the resin layer 41. In the second and third embodiments, the width of each signal pad 12 may be applied as in the fourth embodiment. In the first to third embodiments, the width of each signal wiring 70 may be applied as in the fifth embodiment.

What is claimed is:

1. A semiconductor module comprising:
a power element;
a signal wiring connected to a signal pad of the power element; and
a heat sink configured to cool the power element, wherein
the power element has an active area provided by a portion of the power element where the signal pad is formed,
in the active area, current flows from a bottom surface of the power element to a top surface of the power element, the top surface being opposite to the bottom surface,
the signal pad is thermally connected to the heat sink via the signal wiring, and
in a region where the signal pad is formed, a density of active cells is lower than a density of active cells in another region in the active area.

2. The semiconductor module according to claim 1, wherein
the heat sink is provided by a metal insulating substrate including two metal layers and an insulating layer sandwiched between the two metal layers, and
the signal wiring is stacked on the insulating layer.

3. The semiconductor module according to claim 2, wherein
the signal wiring extends to an outside of the insulating layer.

4. The semiconductor module according to claim 1, wherein
the signal wiring and the heat sink are thermally connected by a resin layer having a thermal conductivity of equal to or more than 2 W/m$^2$K and a thickness of equal to or less than 0.3 mm.

5. The semiconductor module according to claim 1, wherein
the signal pad has a width greater than a width of the signal wiring.

6. The semiconductor module according to claim 1, wherein
the signal pad is provided by a plurality of signal pads, and
among the plurality of signal pads, a width of a signal pad close to a center of the power element is greater than a width of another signal pad farther from the center of the power element.

7. The semiconductor module according to claim 1, wherein
the signal wiring is provided by a plurality of signal wirings, and
among the plurality of signal wirings, a width of a signal wiring close to a center of the power element is greater than a width of another signal wiring farther from the center of the power element.

8. The semiconductor module according to claim 1, further comprising
a temperature sense diode configured to detect a temperature of the power element, wherein
the temperature sense diode is arranged between a source pad of the power element and the signal pad.

9. The semiconductor module according to claim 1, wherein
in the region where the signal pad is formed, the density of active cells is equal to or more than 70% and equal to or less than 90% of the density of active cells in another region in the active area.

10. The semiconductor module according to claim 1, wherein
the power element is provided by a compound semiconductor.

11. The semiconductor module according to claim 1, wherein
an end portion of the signal wiring vertically overlaps a portion of the signal pad.

* * * * *